(12) United States Patent
Yoo et al.

(10) Patent No.: US 8,318,315 B2
(45) Date of Patent: Nov. 27, 2012

(54) METAL-CLAD LAMINATE

(75) Inventors: Hong Yoo, Daejeon (KR); Daenyoun Kim, Daejeon (KR); Cheolho Kim, Daejeon (KR); Byoungwook Jo, Daejeon (KR)

(73) Assignee: SK Innovation Co., Ltd. (KR)

( * ) Notice: Subject to any disclaimer, the term of this patent is extended or adjusted under 35 U.S.C. 154(b) by 109 days.

(21) Appl. No.: 12/745,712

(22) PCT Filed: Dec. 8, 2008

(86) PCT No.: PCT/KR2008/007242
§ 371 (c)(1),
(2), (4) Date: Jun. 2, 2010

(87) PCT Pub. No.: WO2009/082101
PCT Pub. Date: Jul. 2, 2009

(65) Prior Publication Data
US 2010/0255324 A1    Oct. 7, 2010

(30) Foreign Application Priority Data

Dec. 20, 2007    (KR) .................. 10-2007-0133902

(51) Int. Cl.
*B32B 15/08*    (2006.01)
*B32B 27/00*    (2006.01)
*B32B 7/02*    (2006.01)

(52) U.S. Cl. ...... 428/458; 428/212; 428/213; 428/473.5

(58) Field of Classification Search .................. 428/458, 428/473.5, 212, 213
See application file for complete search history.

(56) References Cited

U.S. PATENT DOCUMENTS

| 4,847,353 | A | 7/1989 | Watanabe |
| 4,937,133 | A * | 6/1990 | Watanabe et al. ............ 428/209 |
| 5,262,227 | A | 11/1993 | Takabayashi et al. |
| 7,211,332 | B2 | 5/2007 | Watanabe et al. |
| 7,285,321 | B2 | 10/2007 | Kanakarajan et al. |
| 2007/0169886 | A1 | 7/2007 | Watanabe et al. |

OTHER PUBLICATIONS

International Search Report—PCT/KR2008/007242 dated Jun. 30, 2009.
Chinese Office Action—Chinese Application No. 200880121789.9 issued on Jul. 4, 2012, citing US 4,937,133.

* cited by examiner

*Primary Examiner* — Kevin R Kruer
(74) *Attorney, Agent, or Firm* — Cantor Colburn LLP

(57) ABSTRACT

The present invention relates to a flexible metal-clad laminate for a printed circuit board and a method of manufacturing the same. The flexible metal-clad laminate includes: a first polyimide layer that is disposed on one surface of the metal-clad and has thermal expansion coefficient of 20 ppm/K or less; and a second polyimide layer that is disposed on one surface of the first polyimide layer and has thermal expansion coefficient of 20 ppm/K or more, wherein a difference between the thermal expansion coefficients of the first and second polyimide layers is within 5 ppm/K and a glass transition temperature $T_g$ of resin of the first polyimide layer is $300°C. < T_g < 350°C.$, which is lower than a maximum curing temperature.

3 Claims, No Drawings

METAL-CLAD LAMINATE

TECHNICAL FIELD

The present invention relates to a flexible metal-clad laminate for a printed circuit board and a method of manufacturing the same, and more particularly to, a flexible metal-clad laminate, which is a laminate of polyimide-based resin formed on a conductive metal layer by subjecting to coating, drying, and curing processes and has excellent dimensional stability without causing curl after and before an etching process.

BACKGROUND ART

A rigid printed circuit board (RPCB) used in the related art, which is a laminate of epoxy or phenol-based resin and a conductive metal layer of copper and the like, has a problem in that it does not meet required characteristics of current electronic devices, which are being manufactured as light, slim, short, and small devices. A flexible printed circuit board appearing as an alternative to the rigid printed circuit board has been widely used for a mobile phone, a notebook, a liquid crystal display (LCD) and the like due to easiness of light-weight and slimness and its own inherent flexibility.

A metal-clad laminate used to manufacture the flexible printed circuit board is largely sorted into a three-layer type and a two-layer type. The three-layer type is a form that stacks an insulating film such as polyimide and the like and a conductive metal layer by using an adhesive and the two-layer type is a form where the metal layer is directly bonded on the insulating film without using an adhesive.

However, since the existing three-layer type using the adhesive has the adhesive layer, it has disadvantages in that heat-resistance and flame retardance are degraded and the dimension is greatly changed during an etching process and a heat treatment process. Recently, a study on the metal-clad laminate in the two-layer type that directly stacks the insulating film and the metal layer has been actively progressed.

Generally, the metal-clad laminate in the two-layer type has a problem in that the curl, warp, twist and the like easily occur after and before the etching process due to the thermal expansion difference between the insulating film and the metal layer. As a method for solving the above problem, U.S. Pat. No. 4,847,353, etc., proposed a method of using low thermal expansible polyimide having a specific structure; however, this method cannot be a fundamental solution because adhesive strength is low as well as a conductor is excessively curled inwardly during a process of forming a circuit by etching the conductor.

DISCLOSURE

Technical Problem

The present invention proposes to the above problems. It is an object of the present invention to provide a two-layer metal-clad laminate and a method of manufacturing having high dimensional stability without causing curl, warp, twist and the like after and before an etching process.

Technical Solution

Hereinafter, the present invention will be described in detail.

The present invention relates to a flexible metal-clad laminate of polyimide formed by coating each of two kinds of polyimide precursor solutions on a conductive metal clad and then performing a heat treatment process at least once, the flexible metal-clad laminate including: a first polyimide layer that is disposed on one surface of a conductive metal clad and has thermal expansion coefficient of 20 ppm/K or less; and a second polyimide layer that is disposed on one surface of the first polyimide layer and has thermal expansion coefficient of 20 ppm/K or more, wherein a difference between the thermal expansion coefficients of the first and second polyimide layers is 5 ppm/K or less.

Also, the present invention relates to the flexible metal-clad laminate wherein a glass transition temperature $T_g$ of the first polyimide layer is $300°\,C. \leq T_g \leq 350°\,C.$, which is lower than a maximum curing temperature.

Further, another aspect of the present invention includes a first polyimide layer that is disposed on one surface of a conductive metal layer for a printed circuit board and has thermal expansion coefficient of 15 to 20 ppm/K; and a second polyimide layer that is disposed on one surface of the first polyimide layer and has thermal expansion coefficient of 20 to 25 ppm/K, wherein a difference between the thermal expansion coefficients of the first and second polyimide layers is within 0.1 to 5 ppm/K and a glass transition temperature $T_g$ of resin of the first polyimide layer is $300°\,C. \leq T_g \leq 350°\,C.$, which is lower than a maximum curing temperature.

Surprisingly, when the present invention includes the first polyimide layer and the second polyimide layer under the same conditions, it can achieve the two-layer metal-clad laminate having the dimensional stability without causing the curl, warp, twist and the like after and before the etching process that are indicated as the big problems of actual products up to now and the method of manufacturing the same.

Also, when polyimide having a high glass transition temperature of $300°\,C. \leq T_g \leq 350°\,C.$ is used as the first polyimide layer disposed between the second polyimide layer and a copper clad, a defect phenomenon, such as blistering, delaimination and the like that can easily be caused during the drying and curing processes, can be solved. Thereby, the prevention is completed. In addition, as the first polyimide layer contacting with the metal layer has similar thermal expansion coefficient to the metal layer or a little higher thermal expansion coefficient than the metal layer, and is applied to thermal history of more than the glass transition temperature of the first polyimide layer, it (the first polyimide layer contacting with the metal layer) can maintain high adhesive strength at an interface between the metal layer and the polyimide layer. The conductive metal layer of the present invention means conductive metals, such as copper, aluminum, silver, palladium, nickel, chrome, molybdenum, tungsten and the like and an alloy thereof or a mixture thereof. Generally, copper is widely used, but the present invention is necessarily limited thereto. Further, in order to increase bonding strength between the metal clad and the resin layer, it may be permitted to perform a physical or chemical surface treatment on a surface of the metal layer.

The polyimide-based resin (hereinafter, referred to as "a first polyimide layer"), which is directly stacked on the conductive metal layer, has the thermal expansion coefficient of less than 20 ppm/K and the glass transition temperature $T_g$ of $300°\,C. \leq T_g \leq 350°\,C.$, which is lower than the maximum curing temperature. Residual stress occurs at the interface during the curing process due to a rough surface existing between the first polyimide layer and the metal layer. This is a factor that curls the conductor surface to the inner side when removing the unnecessary metals through the etching process.

Most of the residual stress can be removed by applying the thermal history equal to or higher than the glass transition temperature to resin. Since the first polyimide resin has the glass transition temperature in the range of 300 to 350° C. that is equal to or lower than the maximum curing temperature, it is suitable to remove the above-mentioned residual stress. Also, the present invention has an advantage in that the adhesive strength at the interface between the first polyimide and the metal layer can be stably improved by applying the thermal history equal to or higher than the glass transition temperature of the first polyimide layer.

A new polyimide layer (hereinafter, referred to as 'a second polyimide layer') existing on the first polyimide layer has the thermal expansion coefficient of 20 ppm/K or more, wherein the difference of the thermal expansion coefficient between the new polyimide layer and the first polyimide layer is within 5 ppm/K. The second polyimide layer performs a role of solving the curl caused by the residual stress using the difference of the thermal expansion coefficient with the first polyimide layer. As described above, since the laminate according to the present invention applies the thermal history equal to or higher than the glass transition temperature to remove most of the residual stress, the curl caused by the residual stress can be controlled even by the slight difference of the thermal expansion coefficient equal to or lower than 5 ppm/K. This is suitable to minimize the dimension change caused by heating.

Recently, as the performance and density of the electronic device are increased, the dimension change by thermal shrinkage is revealed as a serious problem. In particular, there is a process (reflow process) of dipping a polyimide film forming a metal line into a solder pot heated at high temperature. When being exposed to such a high temperature, the dimension can be easily changed. This is a factor that causes positional deviation between a circuit pattern on electronic components and a metal pattern on the metal-clad laminate. In particular, a need to consider the dimension change at high temperature is further increased with the introduction of a lead-free solder process. Generally, the dimension change by heating is large as the thermal expansion coefficient of polyimide resin is increased. The polyimide resin used in the present invention has high resistance against the above-mentioned dimension change, since both the first polyimide resin and the second polyimide resin have low thermal expansion coefficient of about 20 ppm/K or so.

A total thickens of polyimide-based resin configuring the laminate of the present invention is in the range of 5 to 100 μm, but is generally used in the range of 10 to 50 μm. When a thickness of the first polyimide resin layer is t1 and a thickness of a secondary polyimide-based resin is t2, the thickness ratio (t2/t1) thereof is defined in consideration of the thermal expansion coefficient values of each resin layer.

As the difference between the thermal expansion coefficients of each layer becomes large, the thickness ratio should be reduced. In contrast, as the thermal expansion coefficient becomes small, the thickness ratio should be increased. Generally, the laminate of the present invention is used in the range of 0.01 to 100 in thickness ratio, preferably 0.1 to 10.

Meanwhile, the polyimide-based resin described in the present invention includes all resins having an imide ring structure, for example, polyimide, polyamideimide, polyesterimide and the like. As tetracarboxylic dianhydride used in synthesizing the polyimide-based resins, pyromellitic dianhydride, 3,3',4,4'-biphenyltetracarboxylic acid dianhydride, 3,3',4,4'-benzophenonetetracarboxylic acid dianhydride and the like is used so as to reveal the low thermal expansibility.

Further, as preferable diamino compounds, 4,4'-diaminophenyl ether, p-phenylenediamine, 4,4'-thiobisbenzenamine and the like is used.

However, if the polyimide resins have characteristics capable of achieving the objects of the present invention, the compositions thereof are not particularly limited, and the compositions of the polyimide resins may include Also, chemical imidizing reagents such as pyridine, quinoline and the like, Adhesion promoters such as silane coupling agent, titanate coupling agent, epoxy compound and the like, other additives such as defoamer for facilitating the coating process, leveling agent may be used.

The polyimide resin itself or the polyimide resin in a semi-cured state may be directly coated on the metal clad.

Generally, a solution of polyimide precursor is coated and then converted into polyimide resin through a thermal and chemical conversion process. As the curing method, any methods may be applied, but in general, a gel film is formed by coating and drying the polyimide precursor resin or the polyimide resin in the semi-cured state and then stayed in a drier at a predetermined temperature for a predetermined time or subjected to the heat treatment by continuously moving inside the drier. The heat treatment is generally performed at high temperature of 300° C. or more and should be necessarily performed once or more at a temperature equal to or higher than the glass transition temperature of the first polyimide resin of the laminate for a sufficient time during the heat treatment process. It is preferable to perform the curing process at high temperature of 20 to 40° C. as compared to the glass transition temperature $T_g$ of the first polyimide resin layer.

As the coating method applicable to the present invention, there may be a knife coating, a roll coating, a die coating, a curtain coating and the like, but all the methods achievable the objects of the present invention can be used.

Advantageous Effects

The present invention can provide the two-layer metal-clad laminate having high dimensional stability without causing curl, warp, twist and the like after and before the etching process.

BEST MODE

Practical and presently preferred embodiments of the present invention will be described in detail with reference to the following experimental examples. However, the present invention is not limited to these experimental examples.

However, it will be appreciated that those skilled in the art, on consideration of this disclosure, may make modifications and improvements within the spirit and scope of the present invention.

Physical properties described in the present invention follow a measuring method to be described below.

[Measurement of Thermal Expansion Coefficient (CTE) and Glass Transition Temperature $T_g$]

The thermal expansion coefficient is obtained by averaging thermal expansion coefficients measured from 100° C. to 250° C. during elevating temperature to 400° C. at a speed of 5° C./min by using thermomechanical analyzer (TMA).

Further, the glass transition temperature $T_g$ is an inflection point of a thermal expansion curve measured through the above-mentioned process.

[Curl]

In order to measure the curl of the laminate after and before the etching process, a sample is cut in a 30 cm-by 30 cm square and heights from the ground of each edge are then measured and averaged. The laminate is considered to be flat when the average value does not exceed 1 cm.

SYNTHESIS EXAMPLE 1

4,4'-diaminophenylether of 2.022 g and p-phenylene diamine of 3.275 g are completely dissolved in N,N-dimethylacetamide solution of 115.8 g under nitrogen atmosphere and 3,3',4,4'-biphenyltetracarboxylic acid dianhydride of 12.000 g is then added, thereby preparing polyamic acid solution of 13 wt %. The prepared solution is casted to the form of a film and then cured by raising temperature to 350° C. for 60 minutes and then maintaining the temperature for 30 minutes. The glass transition temperature and the thermal expansion coefficient measured through the thermalmechanical analysis are 316° C. and 17 ppm/K, respectively.

SYNTHESIS EXAMPLE 2

4,4'-diaminophenylether of 1.179 g and p-phenylene diamine of 1.911 g are completely dissolved in N,N-dimethylacetamide solution of 68.4 g under nitrogen atmosphere and 3,3',4,4'-biphenyltetracarboxylic acid dianhydride of 7.000 g is then added, thereby preparing polyamic acid solution of 13 wt %. The prepared solution is casted to the form of a film and then cured by raising temperature to 350° C. for 60 minutes and then maintaining the temperature for 30 minutes. The glass transition temperature and the thermal expansion coefficient measured through the thermalmechanical analysis are 336° C. and 20 ppm/K, respectively.

SYNTHESIS EXAMPLE 3

4,4'-diaminophenylether of 1.667 g and N-(4-amino-2 methoxyphenyl)benzamide of 3.979 g are completely dissolved in N,N-dimethylacetamide solution of 84.6 g under nitrogen atmosphere and 3,3',4,4'-biphenyltetracarboxylic acid dianhydride of 7.000 g is then added, thereby preparing polyamic acid solution of 13 wt %. The prepared solution is casted to the form of a film and then cured by raising temperature to 350° C. for 60 minutes and then maintaining the temperature for 30 minutes. The glass transition temperature and the thermal expansion coefficient measured through the thermalmechanical analysis are 369° C. and 22 ppm/K, respectively.

SYNTHESIS EXAMPLE 4

4,4'-diaminophenylether of 4.430 g and p-phenylene diamine of 1.595 g are completely dissolved in N,N-dimethylacetamide solution of 121.8 g under nitrogen atmosphere and pyromellitic dianhydride of 6.032 g and 3,3',4,4'-benzophenonetetracarboxylic acid dianhydride of 3.000 g are then added, thereby preparing polyamic acid solution of 13 wt %.

The prepared solution is casted to the form of a film and then cured by raising temperature to 350° C. for 60 minutes and then maintaining the temperature for 30 minutes. The glass transition temperature and the thermal expansion coefficient measured through the thermalmechanical analysis are 353° C. and 23 ppm/K, respectively.

SYNTHESIS EXAMPLE 5

4,4'-diaminophenylether of 1.080 g and p-phenylene diamine of 1.952 g are completely dissolved in N,N-dimethylacetamide solution of 67.1 g under nitrogen atmosphere and 3,3',4,4'-biphenyltetracarboxylic acid dianhydride of 7.000 g is then added, thereby preparing polyamic acid solution of 13 wt %. The prepared solution is casted to the form of a film and then cured by raising temperature to 350° C. for 60 minutes and then maintaining the temperature for 30 minutes. The glass transition temperature and the thermal expansion coefficient measured through the thermalmechanical analysis are 325° C. and 15 ppm/K, respectively.

EXAMPLE 1

The polyamic acid solution prepared by the synthesis example 1 was coated on a copper clad (thermal expansion coefficient of about 17 to 18 ppm/K) having a roughness (Rz) of 3.5 μm and an average thickness of 12 μm, thereby forming the first polyimide precursor layer. Continuously, the polyamic acid solution prepared by the synthesis example 2 was coated on the upper side of the first polyimide precursor layer, thereby forming the second polyimide precursor layer. Then the first polyimide precursor layer and the second polyimide precursor layer were cured at one time, and each thickness of the first and second polyimide layers reached to 14 μm and 4 μm after curing, respectively. The temperature of the above-mentioned laminate was elevated from a normal temperature to 350° C. for 60 minutes and then maintained at 350° C. for 30 minutes, thereby forming the polyimide laminate having a thickness of total 30 μm. The flat copper-clad laminate could be obtained without causing the curl after and before the etching process.

EXAMPLE 2

The polyamic acid solution prepared by the synthesis example 1 was coated on a copper clad (thermal expansion coefficient of about 17 to 18 ppm/K) having a roughness (Rz) of 3.5 μm and an average thickness of 12 μm, thereby forming the first polyimide precursor layer. Continuously, the polyamic acid solution prepared by the synthesis example 3 was coated on the upper side of the first polyimide precursor layer, thereby forming the second polyimide precursor layer. Then, the first polyimide precursor layer and the second polyimide precursor layer were cured at one time, and each thickness of the first and second polyimide layers reached to 20 μm and 2 μm after curing, respectively. The temperature of the above-mentioned laminate was elevated from a normal temperature to 350° C. for 60 minutes and then maintained at 350° C. for 30 minutes, thereby forming the polyimide laminate having a thickness of total 30 μm. The flat copper-clad laminate could be obtained without causing the curl after and before the etching process.

EXAMPLE 3

The polyamic acid solution prepared by the synthesis example 1 was coated on a copper clad (thermal expansion coefficient of about 17 to 18 ppm/K) having a roughness (Rz) of 3.5 μm and an average thickness of 12 μm, thereby forming the first polyimide precursor layer. Continuously, the polyamic acid solution prepared by the synthesis example 4 was coated on the upper side of the first polyimide precursor layer, thereby forming the second polyimide precursor layer. Then the first polyimide precursor layer and the second polyimide precursor layer were cured at one time, and each thickness of the first and second polyimide layers reached to 17 μm and 3 μm after curing, respectively. The temperature of the above-mentioned laminate was elevated from a normal temperature to 350° C. for 60 minutes and then maintained at 350° C. for 30 minutes, thereby forming the polyimide laminate having a thickness of total 27 μm. The flat copper-clad laminate could be obtained without causing the curl after and before the etching process.

COMPARATIVE EXAMPLE 1

The polyamic acid solution prepared by the synthesis example 5 was coated on a copper clad (thermal expansion coefficient of about 17 to 18 ppm/K) having a roughness (Rz) of 3.5 μm and an average thickness of 12 μm, thereby forming the polyimide precursor layer. Then the polyimide precursor layer was cured, and the thickness of the polyimide layer reached to 20 μm after curing. The temperature of the above-mentioned laminate was elevated from a normal temperature to 350° C. for 60 minutes and then maintained at 350° C. for 30 minutes, thereby forming the polyimide laminate having a thickness of total 32 μm. The prepared sample causes the copper clad to curl inwardly after and before the etching process, making it impossible to obtain the flat laminate.

Those skilled in the art will appreciate that the conceptions and specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

The invention claimed is:

1. A flexible metal-clad laminate of polyimide formed by coating each of two kinds of polyimide precursor solutions on a conductive metal clad and then performing a heat treatment process at least once, the flexible metal-clad laminate including:
 a first polyimide layer that is disposed on one surface of a metal clad and has thermal expansion coefficient of 20 ppm/K or less, wherein a glass transition temperature $T_g$ of the first polyimide layer is 300° C.$\leq T_g \leq$350° C., which is lower than a maximum curing temperature; and
 a second polyimide layer that is disposed on one surface of the first polyimide layer and has thermal expansion coefficient of 20 ppm/K or more,
 wherein a difference between the thermal expansion coefficients of the first and second polyimide layers is 5 ppm/K or less, and
 wherein the heat treatment temperature is 20 to 40° C. higher than the glass transition temperature $T_g$ of the first polyimide layer, once or more during the heat treatment process.

2. The flexible metal-clad laminate as set forth in claim 1, wherein a thickness ratio of the first polyimide resin layer and the second polyimide resin layer is 1:100 to 1:0.01.

3. The flexible metal-clad laminate as set forth in claim 1, wherein the used metal clad is selected from a group consisting of copper, aluminum, silver, palladium, nickel, chrome, molybdenum, tungsten and a mixture thereof and an alloy thereof.

* * * * *